United States Patent [19]
Li

[11] Patent Number: 5,824,149
[45] Date of Patent: Oct. 20, 1998

[54] METHOD AND APPARATUS FOR CONTROLLING CRYSTAL TEMPERATURE GRADIENTS IN CRYSTAL GROWING SYSTEMS

[75] Inventor: Zhixin Li, Hudson, N.H.

[73] Assignee: Ferrofluidics Corporation, Nashua, N.H.

[21] Appl. No.: 807,400

[22] Filed: Feb. 27, 1997

Related U.S. Application Data

[60] Provisional application No. 60/012,394 Feb. 28, 1996.
[51] Int. Cl.⁶ .................................................. C30B 15/20
[52] U.S. Cl. .............................. 117/14; 117/15; 117/216; 117/217; 117/218; 117/222
[58] Field of Search ................................ 117/14, 15, 34, 117/216, 217, 218, 222

[56] References Cited

U.S. PATENT DOCUMENTS

| | | | |
|---|---|---|---|
| 4,058,429 | 11/1977 | Duncan | 117/15 |
| 4,086,424 | 4/1978 | Mellen, Sr. | 117/223 |
| 5,129,986 | 7/1992 | Seki et al. | 117/21 |

Primary Examiner—Felisa Garrett

[57] ABSTRACT

An enclosing structure extends into a transition zone of a crystal growing system through which the growing crystal is pulled. One or more independent temperature control devices are secured to the inside surface of the enclosing structure, which control devices sense crystal temperature and supply to, or extract heat from, the crystal so that a carefully-controlled thermal gradient can be established either radially or longitudinally in the crystal. The temperature control devices may include temperature sensors that provide temperature information to a central control device connected to each temperature control device. The enclosing structure may have a hollow wall structure through which a heat exchange fluid, such as water, is passed to extract heat from the transition chamber and crystal. The temperature control apparatus may also be segmented so that each segment can be controlled independently of the remaining segments thereby permitting independent control to be effected at different crystal areas. The temperature control apparatus is supported by a structure attached to the enclosing structure which retains liquids and solid particles that may become detached from the temperature control apparatus during the crystal growth process.

15 Claims, 7 Drawing Sheets

5,824,149

METHOD AND APPARATUS FOR CONTROLLING CRYSTAL TEMPERATURE GRADIENTS IN CRYSTAL GROWING SYSTEMS

This application claims benefit of use Provisional Application No. 60/012,394 filed Feb. 28, 1996.

FIELD OF THE INVENTION

This invention relates to crystal growth systems utilizing a melt from which a crystal seed is withdrawn to form a solid crystal. More particularly, this invention relates to a method and apparatus for controlling crystal temperature gradients of a crystal positioned within a housing for such a crystal growth system.

BACKGROUND OF THE INVENTION

Several techniques are known in the art for growing crystals. The Czochralski process is the most widely used of these processes. In the Czochralski process, a heated crucible is provided for holding a liquid melt form of a charge material from which the crystal is to be grown. The melt is maintained at a temperature slightly above the solidification temperature of the charge material. A crystal seed is placed at one end of a cable or rod that enables the seed to be positioned into the melt material and then to be raised out of the melt material. The seed can be either a sample of the desired crystal material or any other material that has a higher melting temperature and the same crystal structure as the melt material in its solid form. When the seed is lowered into the melt material, it causes a local decrease in melt temperature, as is known to those skilled in the art, which results in a portion of the melt material crystallizing around and below the seed. Thereafter, the seed is slowly withdrawn from the melt and into a crystal growth chamber. As the seed is withdrawn, the portion of the newly formed crystal that remains within the melt essentially acts an extension of the seed and causes melt material to crystallize around and below it. This process continues as the crystal is withdrawn from the melt, resulting in crystal growth as the seed is continually raised away from the melt.

The crystal is withdrawn from the growth chamber and into a transition chamber located above the crucible. The temperature in the transition chamber is lower than that of the crucible. The crystal is finally drawn from the transition chamber into an elongated receiving chamber shaped to accommodate an extended length of crystal. It is current practice also to pass an inert gas from the receiving chamber into the transition chamber at a controlled temperature thereby to effect further cooling of the crystal as it passes from the transition chamber into the receiving chamber. Cooling of the crystal is achieved by passing a cooled heat exchange fluid, such as water, through the walls of the transition chamber which fluid functions to remove heat from an inert gas surrounding the crystal and to remove radiant heat emitted from the crystal. It is desirable to avoid subjecting the housing for a heat exchange liquid to hot spots that can effect vaporization of the liquid within the housing. Heat exchange liquid vaporization limits the rate at which the vapored liquid can absorb heat from the crystal.

A primary goal of crystal drawing systems is to grow crystals that have uniform properties over their entire length. In order to achieve this goal, it is desirable to ensure that the growing conditions for the crystal remain consistent throughout the growth process. A number of factors can influence the growing conditions of the crystal. The thermal and heat transfer characteristics of the transition chamber wall are controlled in order to control the rate of cooling of the crystal being pulled therethrough and thereby promote obtaining uniform properties throughout the crystal being grown. In a system utilizing the Czochralski process, view ports, typically made of transparent quartz glass plates, replace a portion of the transition chamber wall, normally made of stainless steel. The view ports are provided to permit light detection systems, such as those utilized to determine the level of the melt material in the crucible or to monitor temperature, to perform their intended detections functions. In addition, the view ports provide a means for the operator of the process to directly view conditions within the crucible and the transition chamber.

Unfortunately, the thermal and heat transfer characteristics of the quartz glass covering view ports are quite different than the thermal and heat transfer characteristic of the cooled steel wall of the transition chamber. As a result of these differences between thermal and heat transfer characteristics, an inhomogeneous thermal field or gradient is generated inside the transition chamber which can render the growing crystal non-uniform, thereby adversely affecting its quality.

If has been proposed to provide a hollow cooling tube which extends from the receiving chamber into the transition chamber and which is formed of hollow walls to permit a heat exchange fluid to be passed therethrough. The cooling tube extends only a portion of the distance between the receiving chamber and the crucible so that the cooling tube does not block the line of vision between a view port and the portion of the crystal or crucible which is desired to be detected. The cooling tube shields the crystal from the inhomogeneous thermal environment inside the transition chamber and thereby provides a more homogeneous environment. This cooling tube also concentrates the inert gas flowing from the receiving chamber into the transition chamber about the outside surface of the growing crystal, thereby enhancing the cooling effect of the inert gas.

However, the cooling tube cannot rapidly respond to temperature gradients in a growing crystal within the cooling tube. Thus, while the cooling tube, as a source of a heat exchange surface having a generally constant temperature, tends to reduce temperature gradients within the growing crystal, the response time to convert a temperature gradient into relatively constant temperature is slow. This slow response time results from the fact that the cooling tube is capable of only absorbing heat from the crystal and it is not capable of supplying heat to the crystal as a means for controlling temperature gradients.

The Czochralski systems are usually employed to grow silicon crystals where an important consideration is preventing the introduction of contaminating material into the silicon melt that lead to a non-uniform crystal, thereby rendering the crystal useless. Thus, a limited number of materials that are non contaminating with respect to a melt of silicon material are available. For example, the interior of the crucible is lined with $SiO_2$ since it is noncontaminating to the silicon melt.

Accordingly, it would be desirable to provide a method and apparatus for controlling temperature gradients within a growing crystal. In this manner, the temperature gradient can be increased, decreased or shaped as necessary for a particular application. In addition it would be desirable to provide such a method and apparatus which can detect temperature gradients and which can respond quickly to control these temperature gradients. In addition, it would desirable to provide such a method and apparatus which does not introduce contaminants either into the melt or into the crystal being grown. It is an object of the present invention to provide a method and apparatus for controlling temperature gradients in a crystal formed by withdrawing a seed crystal from a melt.

SUMMARY OF THE INVENTION

In accordance with the principles of the invention, an enclosing structure extends into a transition zone of a crystal growth system and temperature control devices are secured to the inside surface of the enclosing structure, which control devices sense crystal temperature and supply to, or extract heat from, the crystal so that a carefully controlled thermal gradient can be established either radially or longitudinally in the crystal.

In one embodiment, the temperature control devices include temperature sensors that provide temperature information to a central control device connected to each temperature control device. The central control device controls energy to the temperature control devices in order to regulate the temperature of each individual temperature control device. The temperature control devices generate a well controlled thermal field to control the size and shape of thermal gradients in the growing crystal. For example heating and cooling devices may be used to increase, decrease or shape the thermal gradient experienced by the crystal as it is drawn into the receiving chamber.

In accordance with another embodiment, the temperature control apparatus is positioned within a cooling tube having a hollow wall structure through which a heat exchange fluid, such as water, is passed to extract heat from the transition chamber and crystal. The temperature control apparatus is positioned about the periphery of an inner surface of the cooling tube and extends through at least a portion of the height of the cooling tube. The temperature of fluid within the cooling tube is maintained relatively uniform by the temperature control devices and heat extraction is effected from the crystal, through the temperature control devices and into the fluid within the cooling tube.

In accordance with another embodiment, the temperature control apparatus is segmented so that each segment can be controlled independently of the remaining segments thereby permitting independent control to be effected at different crystal areas. Each temperature control device segment provides or extracts thermal energy to only a portion of the crystal surface area and the sensor or sensors that sense the temperature of that portion of the crystal surface area regulate the energy to that temperature control device to control the rate of heating or cooling of that portion of the crystal area.

In accordance with a further embodiment, the temperature control apparatus is supported by a structure attached to the cooling tube which retains liquids and solid particles that may become detached from the temperature control apparatus during the crystal growth process. Thus, the apparatus of this invention prevents contamination of the growing crystal which could occur from the temperature control apparatus as a contamination source.

DESCRIPTION OF THE PREFERRED EMBODIMENT

Figures 1, 1A:
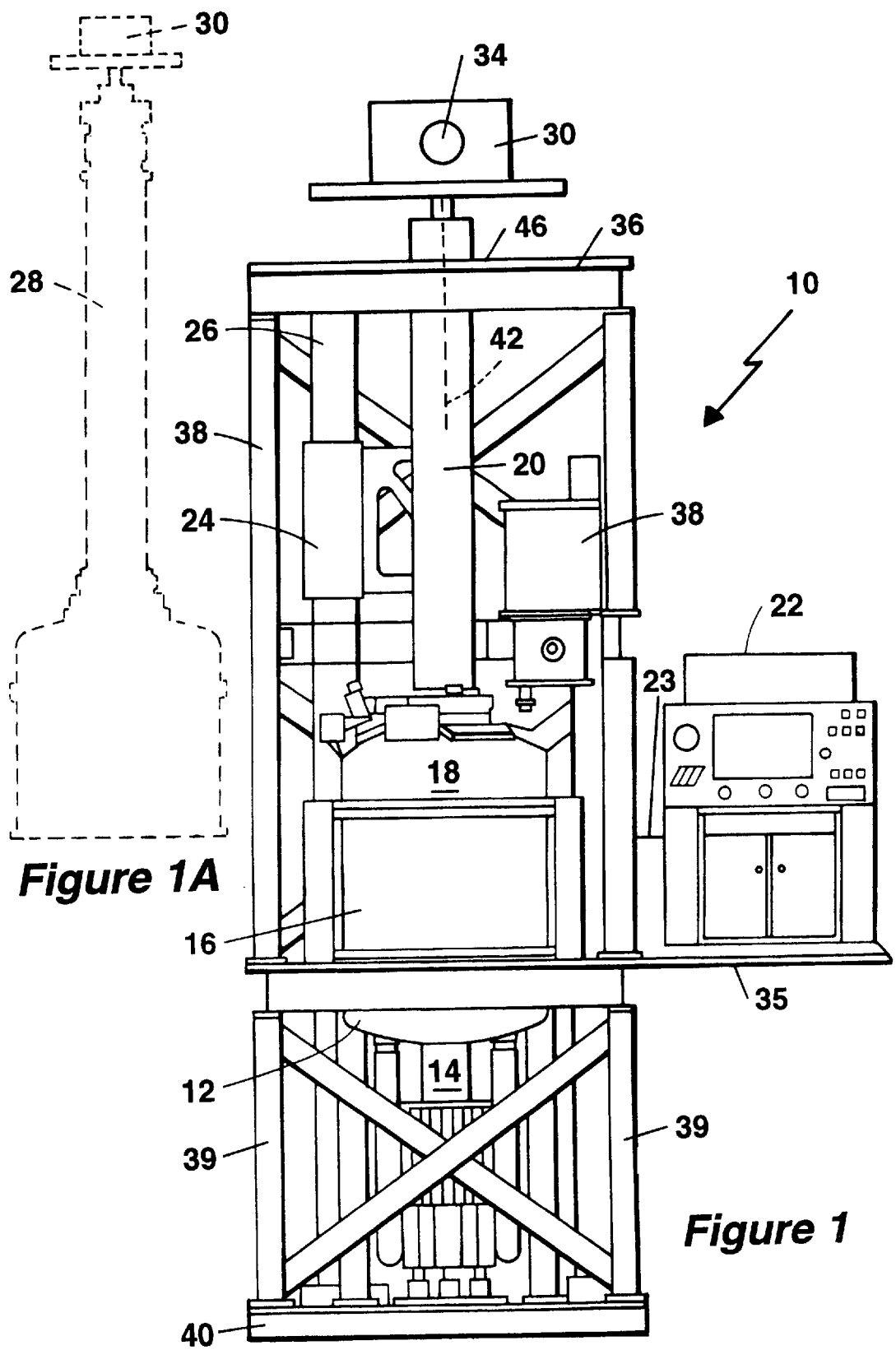
FIG. 1 is a side view of a prior art Czochralski crystal growing apparatus.
FIG. 1A is a phantom view of a portion of the vacuum chamber which has been lifted and moved into a location for servicing the apparatus.

A crystal growing system which utilizes the present invention is illustrated in FIG. 1. The crystal growing system 10 includes a vacuum chamber which includes a base chamber 12 and a growth chamber 16 which together house a crucible (not shown). A crucible lift 14 extends into the base chamber 12 and, under control of lift mechanism 15, functions to adjust the vertical position of the crucible within the base chamber 12 and growth chamber 16. The growth chamber 16 includes heaters which melt the crystal material to form a molten melt charge.

The crystal growing system 10 also includes a transition section 18 wherein the temperature control apparatus of this invention is located and wherein controlled cooling of the crystal is effected. A receiving chamber 20 is positioned above the transition chamber 18 and houses a crystal pulling cable and the crystal emerging from the transition chamber 18.

The vacuum chamber comprising the base chamber 12, the growth chamber 16, the transition chamber 18 and the receiving chamber 20, is supported by a rigid framework including beams 38 and 39 which rest on base 40.

A control system 22 is supported on platform 35 and monitors various parameters of the crystal growing process such as melt level in the crucible, and temperature within a plurality of areas within the transition chamber. Wires 23 connect control system 22 to the inventive temperature control apparatus positioned within transition chamber 18 (not shown in FIG. 1) and described below. The control system 22 also controls process parameters of the system such as the rate at which a seed crystal is withdrawn from the melt and the temperature within the transition chamber as a function of temperature monitored at given areas of the crystal within the transition chamber.

A lift mechanism 24 is movable along the longitudinal axis of guide rod 26 under the control of the control system 22 and is utilized to lift and rotate part or all of the vacuum chamber in order to allow the apparatus to be serviced and to remove the completed crystal. For example, the combination 28 of the receiving, transition and growth chambers can be lifted and rotated into the position shown in dotted lines 28 in order to permit access to the crucible for cleaning. Alternatively, the receiving chamber 20 can be moved alone by the lift apparatus 24 so that the crystal positioned within the receiving chamber 20 can be recovered.

Figure 2:
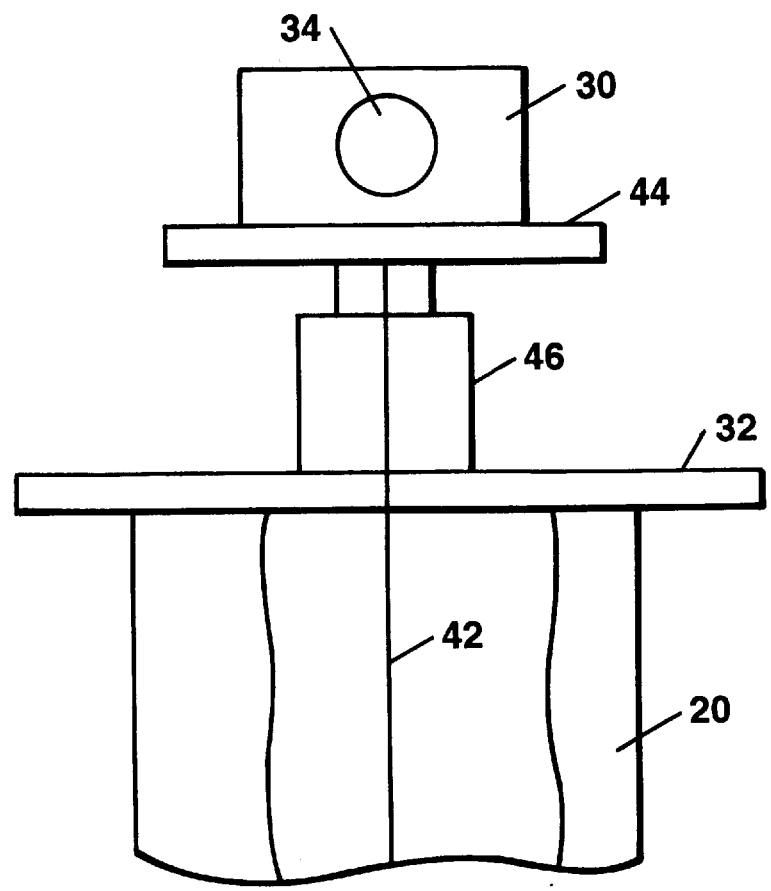
FIG. 2 is a side view of a prior art pull head used in conjunction with the Czochralski growing apparatus of FIG. 1.

Any conventional crystal growing system can be utilized with the temperature control apparatus of this invention. An exemplary crystal growing system, shown in FIGS. 1 and 2, includes a pull head structure 30 supported by the receiving chamber 20. The pull head 30 includes winch motor 34 which, in response to signals from the control system 22, winds or unwinds cable 42 attached to a crystal (not shown). The pull head 30 is mounted on rotatable plate 44 which can rotate in response to a signal from the control system 22 in order to rotate the crystal within the receiving chamber 20 to insure cross-sectional crystal uniformity. The cable 42 passes through a ferrofluidic seal 46 which, in turn, is supported on plate 32 mounted on the receiving chamber 20.

Figure 3:
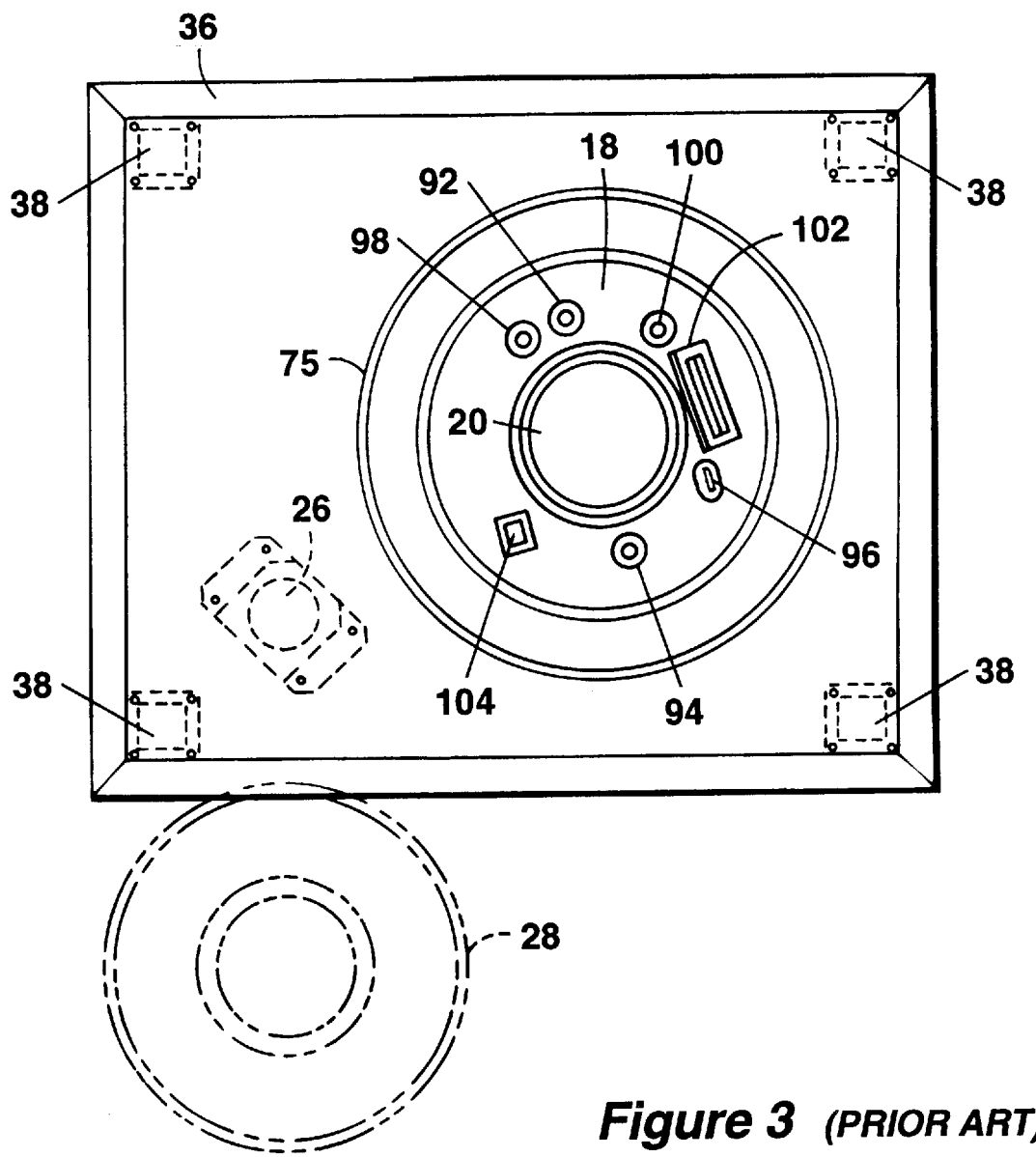
FIG. 3 is a top view of the transition chamber of the apparatus of FIG. 1 showing view ports.

As shown in FIG. 3, the transition chamber 18 typically includes a plurality of ports formed, for example, with quartz glass and including camera ports 92 and 94, laser port 96, feed port 98, detector port 100, operator view port 102 and auxiliary view port 104. The ports 92, 94, 96, 98, 100, 102 and 104 present thermal and heat transfer characteristics different from characteristics of the remainder of the transition chamber wall and cause non-uniform thermal gradients. In order to control crystal growth, it is necessary to control these temperature gradients caused by these differing thermal and heat transfer characteristics.

Figure 4:
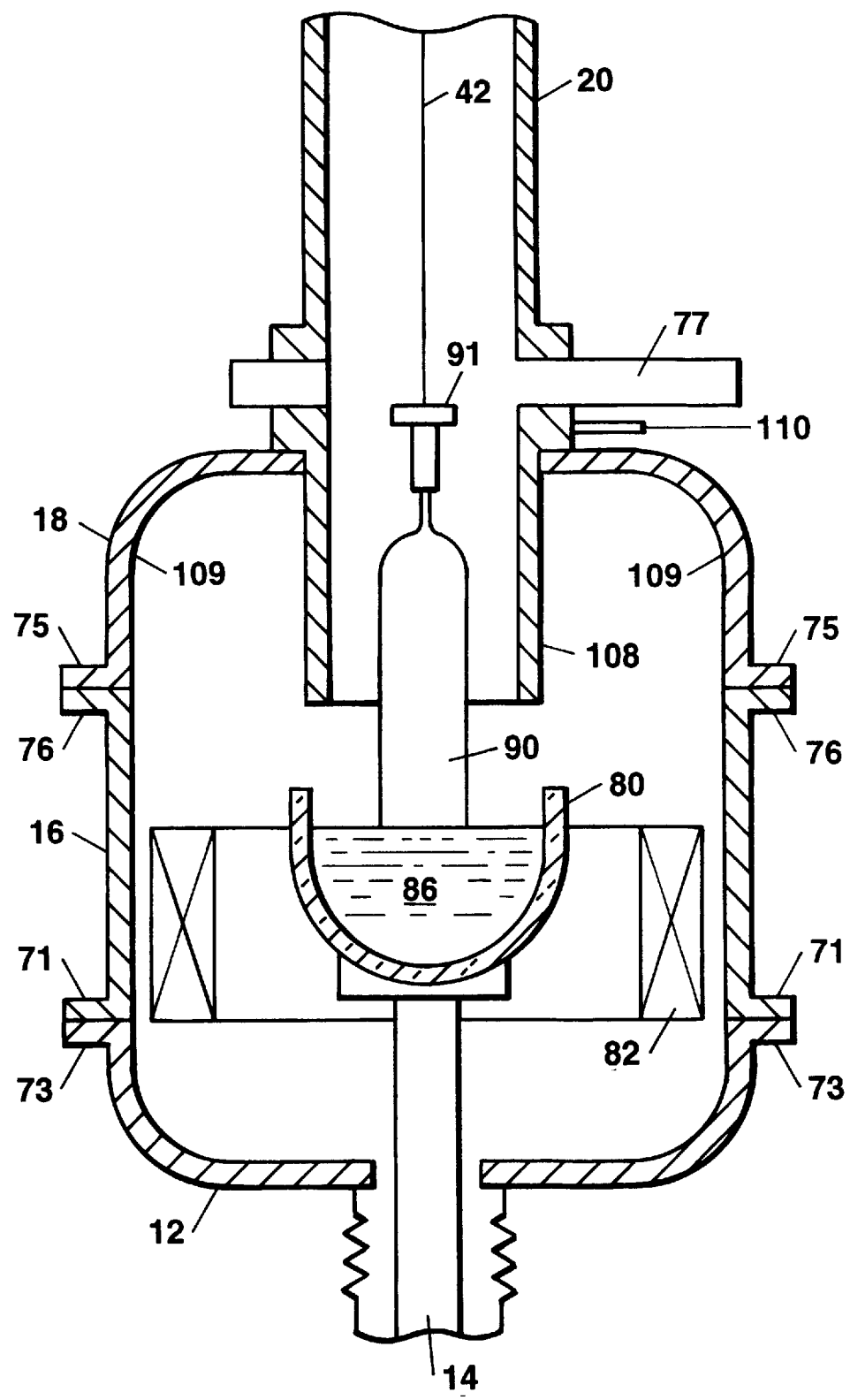
FIG. 4 is a side partial cross-sectional view of an apparatus of the prior art for cooling a growing crystal.

FIG. 4 illustrates a prior art cooling device for a conventional crystal growing system which is intended to reduce the aforementioned problems. The apparatus illustrated includes a base chamber 12 joined to growth chamber 16 by flanges 71 and 73 which extend about the periphery of the base chamber 12 and the growth chamber 16. The growth chamber 16 is joined to transition chamber 18 by flanges 75 and 76 extending about the periphery of the growth chamber 16 and the transition chamber 18. Transition chamber 18 is joined to receiving chamber 20 by isolation valve 77 which extends about the periphery of receiving chamber 20 and allows the receiving chamber to be removed while maintaining a vacuum in the growth chamber.

The crucible 80 is positioned within furnace 82 and is supported by crucible lift 14. Crucible lift 14 functions to adjust the vertical position of the crucible 80 within growth chamber 16 in order to maintain the melt level in the crucible constant relative to the apparatus as the crystal is withdrawn. The furnace 82 heats the molten charge material 86 within crucible 80 to maintain it as a liquid. The seed crystal and the solid crystal 90 formed from the molten charge material 86 is secured to cable 42 by means of a seed chuck 91. The cable 42 can be rotated and pulled upwardly, as described above to, in turn, rotate and pull the crystal 90.

In order to provide a homogeneous thermal environment, as shown in FIG. 4, a cooling tube 108 extends from the top of the transition chamber 18, through the chamber and can extend into the growth chamber 16. The cooling tube 108 blocks the line of sight between the ports described above with reference to FIG. 3 and the crystal surface so that the crystal "sees" the interior of the cooling tube 108. In addition, the cooling tube 108 may have an internal cavity (not shown) which is connected to a source of cooling liquid by a conduit 110. The cooling liquid cools the walls of tube 108 by conduction in order to maintain the walls at a relatively constant temperature. The constant temperature produces a more rapid cooling of the crystal 90.

Since the cooling tube 108 blocks the line of sight between a portion of the crystal 90 and the ports in transition chamber 18, the portion of the crystal 90 which is within the tube is not subjected to differing conditions which affect heat radiation between the crystal 90 and the transition chamber walls 109 and ports due to the different radiation absorbing characteristics of the ports and the walls 109. However, the portion of the crystal 90 which extends outside of the cooling tube 108 is subjected to the non-uniform conditions of radiation absorption. Thus, temperature gradients can still occur within the crystal 90 prior to entering the cooling tube 108 and these gradients may remain present while the crystal 90 moves through the tube 108. Since the tube 108 is either not cooled or utilizes a common source of cooling liquid, the walls are held at either a constant temperature or form a constant temperature gradient. Consequently, this device cannot accurately control temperature gradients within the crystal 90.

Figure 5:
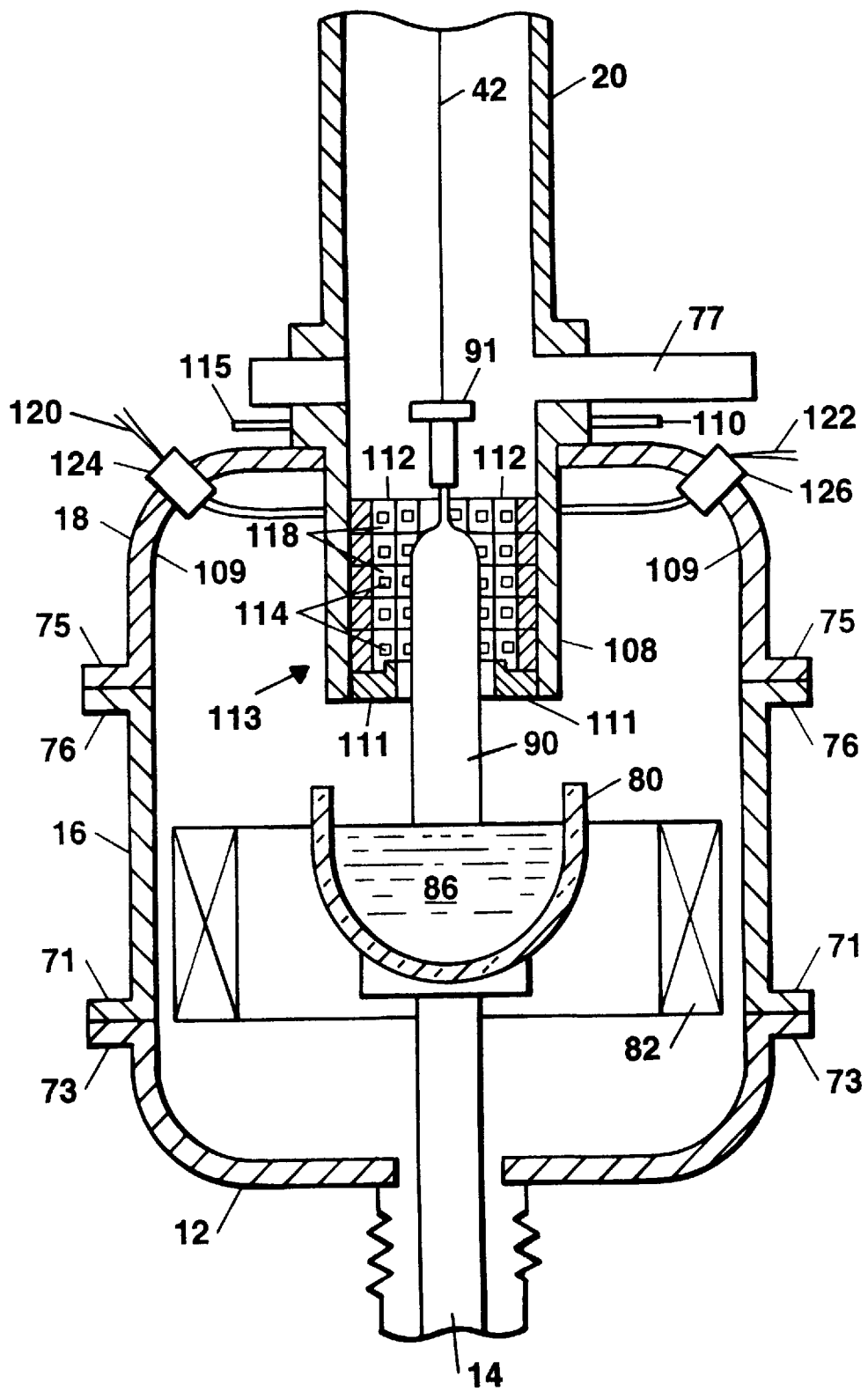
FIG. 5 is a partial cross-sectional view of a temperature control apparatus constructed in accordance with one embodiment of this invention.

Referring to FIG. 5, like elements to the elements of FIGS. 3 and 4 are designated by the same reference numerals. FIG. 5 illustrates one embodiment of the temperature control apparatus 113 of this invention which comprises a segmented apparatus 113 formed of the plurality of temperature control devices 112. The temperature control apparatus 113 is positioned on support shelf 111 which extends about the bottom inside surface of cooling tube 108. The temperature control apparatus 113 also is positioned in a heat exchange relationship, preferably in contact with the cooling tube 108. Heat exchange fluid is supplied to cooling tube 108 through conduit 110 and is removed therefrom through conduit 115 to effect heat removal from cooling tube 108. As with the embodiment illustrated in FIG. 4, tube 108 has an internal cavity in which the cooling fluid circulates. The cavity has not been illustrated in order to clarify the figure.

The support shelf 111 prevents any portion of the temperature control apparatus which may break off from dropping into and contaminating melt 86.

The temperature control devices 112 each comprise a temperature sensing portion 114 such as an infrared sensor, thermocouple, or other temperature sensor and a heater 118 capable of producing a given amount of heat in response to a given supply of power such as a resistance heater, graphite heater or other electrothermal device. The temperature control elements are powered by electrical leads 120 and 122 which pass through the walls of transition chamber 18 by means of insulating feedthroughs 124 and 126, respectively.

The individual temperature control elements 118 can be individually controlled in order to equalize temperature gradients in the crystal. The temperature sensing portion 114 of each temperature control element is capable of sensing temperature within the normal temperature range of a crystal being formed from a melt. The temperature sensing portion 114 and heater 118 of each control device 112 function together so that the extent to which the heater 118 is powered depends upon the crystal surface temperature measured by the temperature sensing portion 114.

Figure 6:
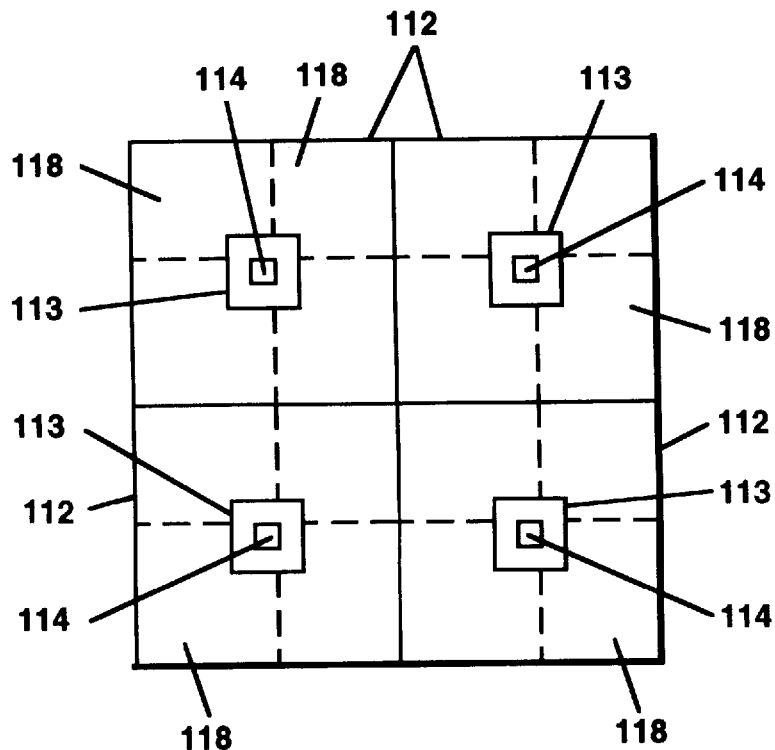
FIG. 6 is an expanded side view of a portion of the temperature control apparatus constructed in accordance with one embodiment of this invention.
Figure 7:
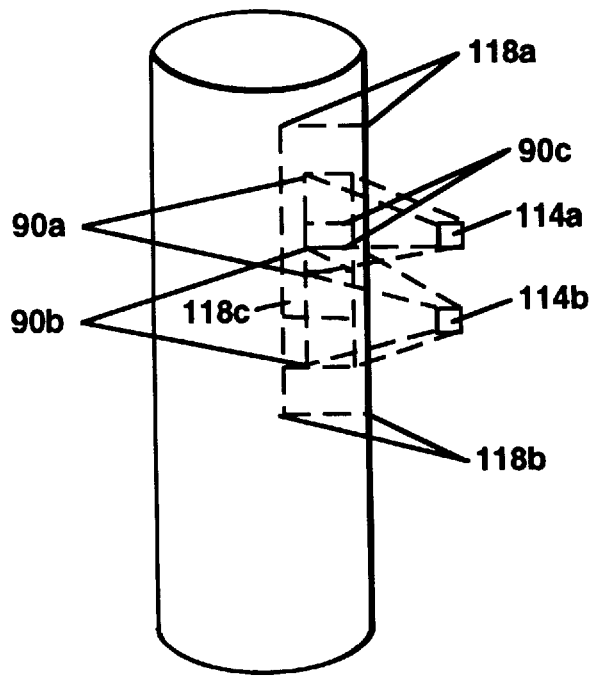
FIG. 7 is a perspective diagram illustrating the operation of the apparatus of this invention.

Referring to FIG. 6 and 7, an exemplary temperature control system is illustrated. Each temperature control device comprises a temperature sensing portion 114, separated from heater 118 by a thermal insulating composition 113. Each heater 118 can be subdivided into smaller independently controlled heaters as indicated by the dotted lines.

Heaters are not shown in FIG. 7 for purposes of clarity. As shown in FIG. 7, the crystal surface area 90a enclosed within the line of sight of temperature sensing portion 114 overlaps the area 90b enclosed within the line of sight of temperature sensing portion 114b. Thus, the common area 90c defined by the overlap of area 90a and 90b is sensed by the two sensor 114a and 114b. In addition, the area 118a which is within the line sight of a heater (not shown) positioned about sensing portion 114a and the area 118b which is within the line of sight of a heater (not shown) positioned about sensing portion 114b overlap to form area 118c. Due to the overlapping areas, a control means can be utilized in controller 22 to direct the proper power to adjust the heat emitted by the heaters 118 to compensate for these areas of overlaps, thereby to control the temperature on the crystal surface areas 118a and 118b.

Figure 8:
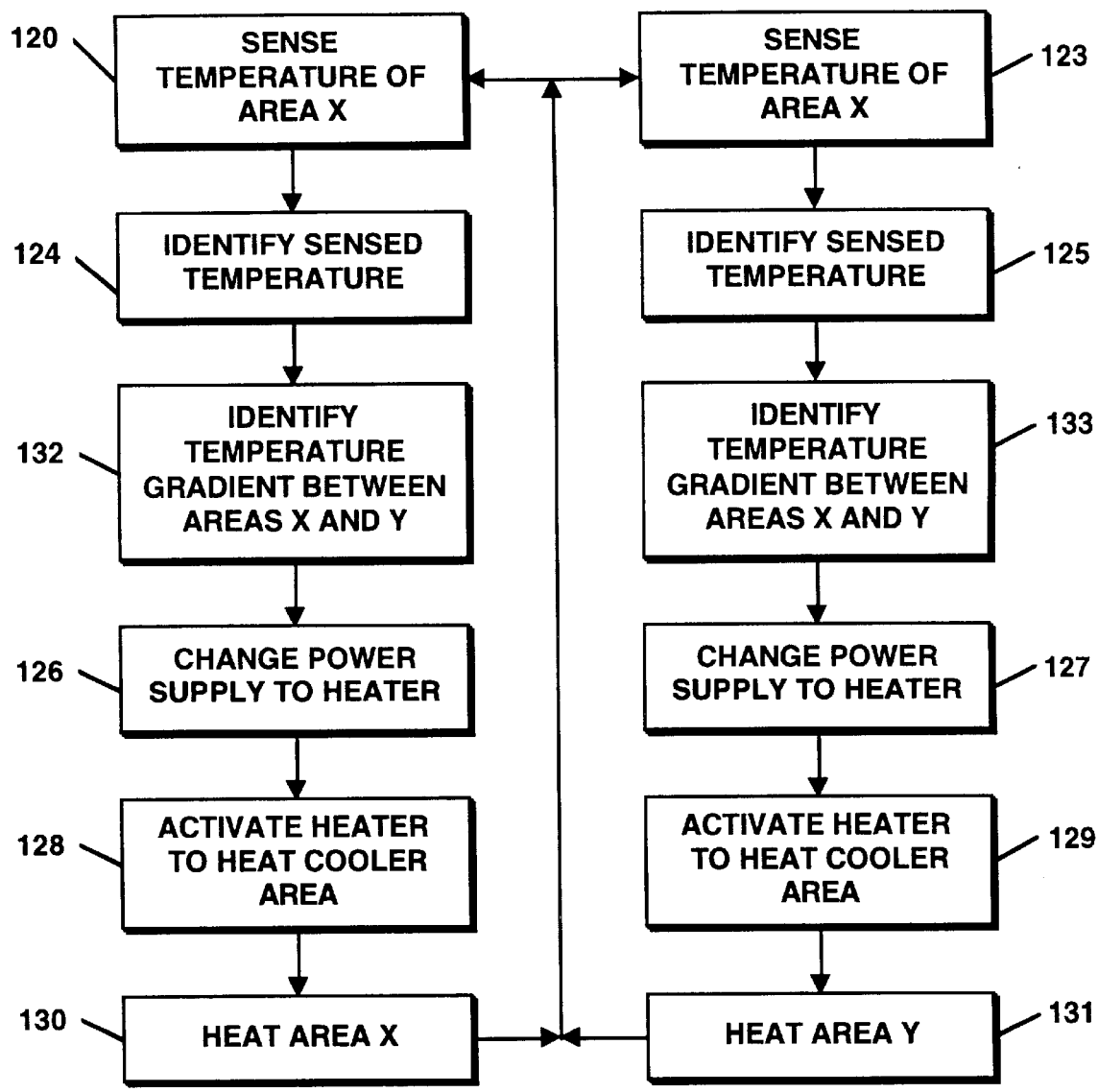
FIG. 8 is a flow diagram illustrating the process of this invention.

Referring to FIG. 8, one embodiment of the process of this invention is illustrated which can be utilized in conjunction with the apparatus described with reference to FIGS. 6 and 7. The process illustrated in FIG. 8 shows an embodiment wherein temperatures of adjacent areas of the growing crystal are sensed and, in response to the sensed temperatures, control means are activated to control crystal temperature gradients in those adjacent areas. The process of this invention includes the step 120 of sensing temperature on crystal area X. The sensed temperature in area X is then identified at step 124. Similarly, the temperature of crystal area Y is sensed in step 123 and identified in step 125.

A temperature gradient between area X and Y is identified in steps 132 and 133. In response to the identified temperature gradient, the power supply to the heater associated with the sensor is changed in step 126 or 127 and the heater for the area (X or Y) which is coolest is activated by a power supply in step 128 or 129. The activated heater then heats crystal area X or Y in step 130 or 131. These process steps are repeated until a temperature gradient on the crystal surface is not sensed in steps 132 and 133. Alternatively, the heaters can be activated to produce a predetermined temperature gradient between areas X and Y.

Although only a few illustrative embodiments have been disclosed, other embodiments will be apparent to those skilled in the art. For example, although a segmented temperature control device is described in the above examples, it is obvious that the temperature control device may have one, or more, temperature control elements. A single heating or cooling element can be used to anneal a crystal as it passes through the temperature control device. Further, the temperature control devices may cool or heat the crystal. For this purpose electrothermal coolers can be used. In addition, electrothermal coolers can be interspersed with heaters in order to generate a particular thermal profile both radially and longitudinally for a particular growing process. Depending on the process, it may be desirable to minimize the thermal gradients, maximize the thermal gradients or generate a specific thermal contour on the crystal surface. All of these profiles can be realized by appropriately configuring the thermal control devices. These modifications and others which will be apparent to those skilled in the art are intended to be covered by the following claims.

What is claimed is:

1. A method for controlling temperature gradients in a solid crystal formed by pulling a seed crystal from a molten charge material which method comprises the steps of:
   A. positioning at least a portion of said solid crystal within an enclosing structure having an inner surface in thermal contact with a surface of the crystal portion;
   B. sensing temperature at the crystal portion surface with a sensing means; and
   C. controlling temperature on a portion of the enclosing structure which portion is less then the entire inner surface of the enclosing structure in response to the temperature sensed in step B.

2. The method of claim 1 wherein step A comprises the step of:
   A1. pulling the crystal through at least a portion of said enclosing structure while cooling said solid crystal.

3. The method of claim 2 wherein step A1 further comprises the step of:
   A1A. rotating the crystal within the enclosing structure while cooling said solid crystal.

4. The method of claim 1 wherein step B comprises the step of:
   B1. sensing temperature at surfaces of a plurality of crystal portions with a plurality of sensing means.

5. The method of claim 1 wherein step C comprises the step of:
   C1. controlling temperature on a plurality of enclosing structure portions.

6. The method of claim 1 wherein step C comprises the step of:
   C2. controlling a temperature of a first enclosing structure portion independently of a temperature on another enclosing structure portion.

7. The method of claim 1 wherein step C comprises the step of:
   C3. increasing a temperature of a first enclosing structure portion and decreasing a temperature on another enclosing structure portion.

8. Apparatus for controlling temperature gradients in a solid crystal formed by pulling a seed crystal from a molten charge material in a crucible, which apparatus comprises:
   means for positioning at least a portion of said solid crystal within an enclosing structure having an inner surface in thermal contact with a surface of the crystal portion;
   a temperature sensor which senses temperature at the crystal portion surface; and
   a temperature control mechanism responsive to the temperature sensed by the temperature sensor for controlling temperature on a portion of the enclosing structure which portion is less then the entire inner surface of the enclosing structure.

9. The apparatus claim 8 wherein the positioning means comprises means for pulling the crystal through at least a portion of said enclosing structure while cooling said solid crystal.

10. The apparatus of claim 9 wherein the temperature sensor comprises means for rotating the crystal within the enclosing structure while cooling said solid crystal.

11. The apparatus of claim 8 wherein the temperature sensor comprises a plurality of temperature sensors for sensing temperature at surfaces of a plurality of crystal portions.

12. The apparatus of claim 8 wherein the temperature control mechanism comprises a plurality of independent temperature control devices for controlling temperature on a plurality of enclosing structure portions.

13. The apparatus of claim 8 wherein the temperature control mechanism further comprises means for controlling a temperature of a first enclosing structure portion independently of a temperature on another enclosing structure portion.

14. The apparatus of claim 8 wherein the temperature control mechanism comprises a heater for increasing a temperature of a first enclosing structure portion and a cooler for decreasing a temperature on another enclosing structure portion.

15. The apparatus of claim 8 further comprising means connected to the enclosing structure for preventing debris generated by the temperature control means from falling into the crucible.

* * * * *